United States Patent [19]

Morimoto et al.

[11] 3,967,125

[45] June 29, 1976

[54] METHOD AND APPARATUS FOR MAKING PHOSPHORS

[75] Inventors: Kiyoshi Morimoto; Yukihiko Utamura, both of Mobara; Toshinori Takagi, Nagaokakyo, all of Japan

[73] Assignee: Futaba Denshi Kogyo K.K., Japan

[22] Filed: Feb. 24, 1975

[21] Appl. No.: 552,607

[30] Foreign Application Priority Data

Feb. 22, 1974 Japan.............................. 49-20457

[52] U.S. Cl. ........................ 250/432 R; 250/492 B
[51] Int. Cl.² .......................................... H01J 37/00
[58] Field of Search........ 250/398, 400, 432, 492 R, 250/492 B; 219/121 EB

[56] References Cited
UNITED STATES PATENTS

| 3,835,327 | 9/1974 | Lawrence | 250/492 B |
| 2,992,329 | 7/1961 | Jeppson | 250/492 B |

*Primary Examiner*—Craig E. Church
*Attorney, Agent, or Firm*—Oblon, Fisher, Spivak, McClelland & Maier

[57] ABSTRACT

A method of preparing a phosphor by injection of activator ions which become luminescent centers into crystals of a base material of the phosphor comprising the steps of generating ions of an activator, accelerating the activator ions by giving kinetic energy thereto, irradiating and injecting the accelerated activator ions into the base material, and agitating the base material.

An apparatus for preparing phosphor according to the method of the invention comprises an activator ion source section having an ion generating section for generating activator ions and an ion accelerating electrode section for accelerating and irradiating the generated activator ions into the base material of the phosphor, a base activating vessel section having an agitating means for containing the base material of the phosphor and for continuously circulating the same therein in order to uniformly irradiate the accelerated activator ions into the base material of the phosphor, and a vacuum system for providing a low-pressure atmosphere at least to the activator ion source section and the base activating vessel section.

5 Claims, 3 Drawing Figures

METHOD AND APPARATUS FOR MAKING PHOSPHORS

BACKGROUND OF THE INVENTION

The present invention relates to a novel method and apparatus for making phosphors.

The phosphors which have traditionally been used are prepared by synthesis under rigid conditions and by means of skilled techniques. The general method for preparing phosphors involves adding traces of activators consisting of various elements which can become luminescent centers, such as silver, arsenic, copper, europium, manganese, phosphorus, lead, antimony, tin and zinc, to base materials that can become phosphor host materials, such as oxide, sulfide, halide and oxysalt of barium, beryllium, calcium, cadmium, sodium, magnesium, strontium, yttrium, zinc and the like, then suitably adding a flux, such as halogenated alkali, in order to facilitate entrance of the activator into the base crystals and finally heating and baking these materials in a fully regulated and controlled atmosphere at 700° to 1300°C for several tens of minutes to a few hours. In other words, the conventional method of preparing phosphors requires such severe preparation-step control conditions as heating and baking in a fully controlled atmosphere for an extended period of time at an elevated temperature that risk of decomposition of the base material itself actually becomes a problem.

SUMMARY OF THE INVENTION

Accordingly, it is an object of the present invention to provide an improved method of producing clean and pure phosphors.

Another object of the present invention is to provide an improved method of producing phosphors in which danger of decomposition of the base material due to heating at very high temperature over long periods of time is eliminated.

A further object of the invention is to provide an improved method for making phosphors which is easy to control and is reliable for producing pure phosphors.

Still a further object is to provide an apparatus for performing the foregoing noted methods which is small in size and yet provides stable and reliable conditions for producing phosphors which are free of contamination.

The foregoing and other objects are attained according to the present invention through the provision of a method and an apparatus for preparing phosphors which effectively activate the base material by sucessively introducing activator ions which serve as luminescent centers into crystals of the base material through the steps of generating by electron bombardment or plasma process ions of activators of various elements which can become luminescent centers of the phosphor, such as silver, arsenic, copper, europium, manganese, phosphorus, lead, antimony, tin and zinc, accelerating these activator ions by giving kinetic energy by means of an electric electric field, irradiating and injecting the activator ions into a base material which can become a phosphor master material, such as oxide, sulfide, halide or oxysalt of barium, beryllium, calcium, cadmium, sodium, magnesium, strontium, yttrium, zinc or the like, and agitating the irradiated base material.

BRIEF DESCRIPTION OF THE DRAWINGS

Various other objects, features and attendant advantages of the present invention will be more fully appreciated as the same becomes better understood from the following detailed description, when considered in conjunction with the accompanying drawings, in which like reference numerals designate like or corresponding parts in the several views and wherein.

DETAILED DESCRIPTION OF THE PREFERRED EMBODIMENTS

Figure 1:
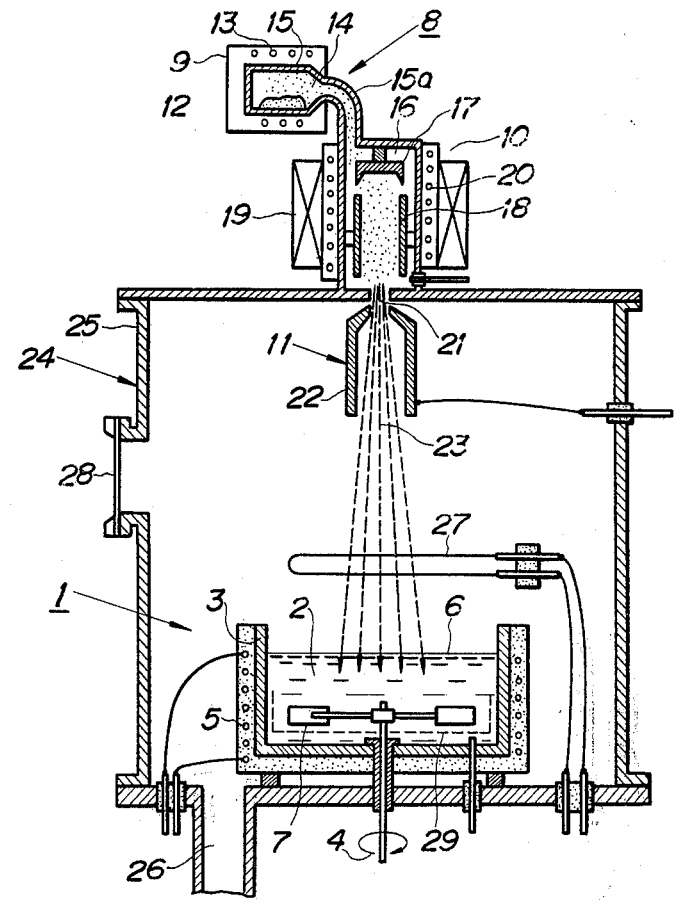
FIG. 1 is a principal sectional view showing a first embodiment of an apparatus for preparing phosphors in accordance with the method of the present invention.

Referring now to the drawings, and more particularly to FIG. 1 thereof, a phosphor base activating vessel section 1 is shown having a base vessel 3 for holding a powdered base material 2 which becomes a phosphor master material, an agitator 4 for agitating the base material 2 in the base vessel 3 and a heater 5 arranged about the base vessel 3 for heating the base material 2 therein to a given desired temperature. The base material 2 may be arbitrarily selected for use from among those phosphor master materials, such as, for example, oxide, sulfide, halide and oxysalt of barium, beryllium, calcium, cadmium, sodium, magnesium, strontium, yttrium, zinc or the like, which meet the intended application of the phosphor to be produced. The agitator 4 is a unit designed for agitating the base material 2 in the vessel 3 so that the base material at the top surface 6 thereof to be irradiated with activator ions, as will be hereinafter described, is progressively replaced by the base material below it and, as shown herein, is equipped with agitating elements, or vanes, which are rotated in the powdered base material 2 for providing such agitation. The invention, however, is not to be limited to this particular method of agitation, as various other means can of course be applied for agitating the base material 2, such, for example, by arranging a single or a plurality of agitating elements of various forms for rotating, reciprocating, vibrating or causing any other type of motion in the base material or by providing a driving means for rocking, vibrating, rotating or moving in any other manner the whole or any part of the base vessel 3 itself.

An activator ion source section generally designated by the reference numeral 8 consists of an activator vapor generator 9, an ion generating section 10 and an ion accelerating section 11.

The activator vapor generator 9 is equipped with a furnace 15 which is designed to produce a vapor 14 of an activator 12 by holding and heating the activator 12 with a heating unit 13, such as, for example, a heater disposed thereabout. The furnace 15 is connected through a guide 15a to an ion generating chamber 16 of the ion generating section 10 to feed the generated vapor 14 from the furnace 15 into the ion generating chamber 16. The activator 12, which is used for synthesis with an activation of the phosphor base material 2, may be selected from among such elements, for example, as silver, arsenic, copper, europium, manganese, phosphorus, lead, antimony, tin and zinc or from among compounds containing any of the above elements. While the embodiment shown in FIG. 1 utilizes a heating unit 13 to produce the vapor 14 of the activator 12, any other suitable means may of course be used for heating the furnace 15 or the activator 12. For example, high-frequency induction or electron bombardment might be employed.

The ion generating section 10 is equipped with the ion generating chamber 16 in which are arranged a cathode 17 and an anode 18 for providing a voltage discharge, a magnetic coil 19 disposed about the chamber 16 to effect plasma discharge in the ion generating chamber 16, and a heating unit 20 disposed between the chamber 16 and the magnetic coil 19 to prevent condensation of the vapor 14 of the activator 12 being fed into the ion generating chamber 16. The vapor 14 of the activator 12 fed into the ion generating chamber 16 is ionized by the action of a discharge voltage of several hundred to several thousand volts applied between the discharge cathode 17 and anode 18, as well as by the action of a magnetic field produced by the magnetic coil 19, and thus forms plasma.

The ion accelerating section 11 is formed by an ion accelerating electrode 22 of a barrel-shaped configuration arranged close to an ion extracting port 21 provided in the ion generating chamber 16. Positive ions 23 of the activator are extracted through the ion extracting port 21 from the plasma formed in the ion generating chamber 16 by application to the ion accelerating electrode 22 of a negative potential of several thousand to several tens of thousands of volts, preferably of 5 kV to 10 kV, with respect to the ion generating chamber 16, accelerated by being given kinetic energy by an electric field produced by the ion accelerating electrode 22, which is open downwardly in the direction of the opened top of the base vessel 3, and irradiated against the top layer 6 of the phosphor base material 2 contained in the base vessel 3. The activator ions are thus injected into the crystals of the base material 2 in the top layer 6 thereof, but can enter to a depth of several tens of angstroms or a few microns only. However, since the base material in the top layer 6 is continuously replaced by the agitator 4 provided in the base vessel 3, the activator ions can be very efficiently and effectively injected throughout the base material 2 contained in the base vessel 3. Some of the activator ions injected into the crystals of the base material 2 become replacement atoms which directly become luminescent centers, while others exist in the crystals as the so-called clearance atoms in the same state as injected. The phophor can be efficiently produced because the activator ions which exist as the clearance atoms can be readily turned into the replacement atoms, which become luminescent centers, by heating the base material 2 at a low temperature of approximatly 400°C to 600°C with the heating unit 5 arranged in the base vessel 3. The heating operation to change the injected activator ions which exist as clearance atoms in the crystals of the base material 2 into replacement atoms may of course be effected by any suitable step following the irradiation and injection of the activator ions into the base material 2.

The base activating vessel section 1 and the activator ion source section 8 are arranged inside a vacuum unit 24 consisting of an external vacuum container 25 and an evacuating unit, not shown, so that they can operate on power supplied through terminals introduced in an airtight manner from outside. Connection of the external vacuum container 25 with the evacuating unit through an evacuating port 26 and operation of the evacuating unit allow a low-pressure atmosphere to be produced in the external vacuum container 25 and the base activating vessel section 1 and the activator ion source section 8 arranged therein to form the conditions best capable of producing phosphor in accordance with the present invention. While only one evacuating port 26 is shown in FIG. 1, more than one evacuating ports may of course be separately provided in the activator ion source section and elsewhere as needed.

A charge neutralizing electrode 27 is provided with a filament which can emit electrons. The charge neutralizing electrode 27 is installed within the vacuum container 25 above the base vessel 3 so that charges successively accumulated on the surface of the base material 2 and the like during opertion of the apparatus for preparing the phosphor according to the present invention can be neutralized by electrons emitted by its heated filament. This permits the phosphor preparing apparatus of this invention to maintain stable operating conditions and to continuously produce phosphor.

A sight window 28 is provided in a part of the external vacuum container 25 so that the base material 2 contained in the base vessel 3 can be visually observed from the outside. Provision of this window 28 makes manufacture of the phosphor in the unit possible while observing the phosphor base material 2 placed therewithin.

A phosphor electrode 29 is suitably projected into the base material 2 in the base vessel 3 for carrying electricity between itself and the charge neutralizing electrode 27 through the material 2. Suitable application and passage of a voltage of several hundred volts between the charge neutralizing electrode 27 and the phosphor electrode 29 during manufacture of the phosphor excites the base material 2 by electron bombardment from the charge neutralizing electrode 27 and causes the base material 2 to luminesce as the activation of the base material 2 proceeds. The phosphor can be effectively prepared while observing this luminescent state through the sight window 28. An observation section of the window type is illustrated in FIG. 1, however, any other type of construction may of course by adopted which provides for observation of the base material from outside, such as, for example, by forming part or most of the external vacuum container 25 of a transparent material.

Figure 2:
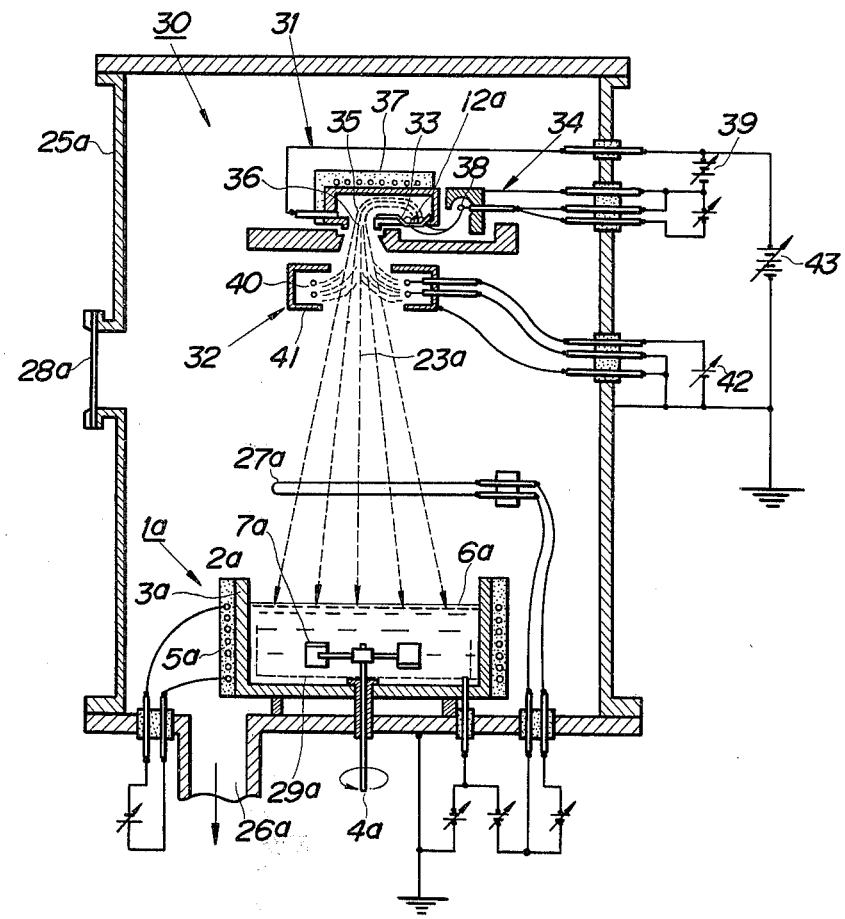
FIG. 2 is a principal sectional view showing a second embodiment of an apparatus of the present invention.

Referring now to FIG. 2, illustrating a second embodiment of a phosphor preparing apparatus according to the present invention, a phosphor base activating vessel section 1a, practically identical in construction with that of the first already described embodiment, is shown, while an activator ion source section 30 of the electron bombardment type is employed. Therefore, the activator ion source section 30 will now be described.

The activator ion source section 30 consists of an activator vapor generating section 31 and an ion generating section 32, which also serves as an ion accelerating electrode section. The activator vapor generating section 31 is so constructed as to permit placing an activator 12a in a crucible 33 thereof, whereby vapor of the activator 12a may be generated by heating it with a crucible heating unit 34 and the generated vapor may flow through a vapor guide section 35, combined with the crucible 33, and a vapor port 35, provided in the vapor guide section 35, in the direction of a base material 2a contained therebelow in a base vessel 3a. An auxiliary heating unit 35 is disposed about the vapor guide section 35 and is provided to prevent condensation of the vapor of the activator 12a in the vapor guide section 35. Similarly to the embodiment illustrated in FIG. 1, any suitable substance may be selected and used as the activator 12a that can be synthesized with and activate the phosphor host material 2a. The heating means to evaporate the activator 12 a, shown in FIG. 2, is of such a construction that the crucible 33 is heated by electron bombardment produced by a filament 38 located in the heating unit 34 and a high-voltage supply 39. Without being limited to this type of construction, any other means may of course be employed that can heat the crucible 33 or the activator itself through electric heating, high-frequency induction or electron bombardment.

The ion generating section 32 of this embodiment is equipped with an annular ion accelerating electrode section 41 which has an electron source 40 disposed in an annulus about the vapor being passed therethrough, wherein the vapor of the activator 12a discharged through the vapor port 35, or a lumpy atom group or a cluster produced by the condensation of the vapor, is ionized by electron bombardment and the ions so obtained are accelerated downwardly. That is, the ion generating section 32 forms activator ions 23a by bombarding electrons at the vapor or cluster of the activator 12a coming out of the vapor port 36 by means of a heating power supply 42 and a high-voltage supply 43 connected to the electron source 40. The generated activator ions 23a are thus given kinetic energy and are accelerated by an electric field of the ion accelerating electrode section 41, and are irradiated against the top layer 6a of the phosphor base material 2a in the base vessel 3a therebelow. The base material 2a is activated by injection and replacement of activator ions which become luminescent centers, and a phosphor is thus formed. Since the top layer 6a of the base material 2a against which the activator ions 23a are irradiated is continuously agitated by an agitating unit 4a and thus continuously replaced with the base material below the top surface as in the embodiment of FIG. 1, the base material 2a is extemely efficiently injected with the activator ions to form the phosphor.

The two embodiments of the phosphor preparing apparatus according to the present invention described above use the standard, so-called cold cathode PIG type and electron bombardment type as the ion sources for producing activator ions. In addition to these types, there may of course be employed ion sources of various types such as those utilizing ionization by collision of electrons in a so-called gas discharge, or ion sources of types utilizing other principles.

Figure 3:
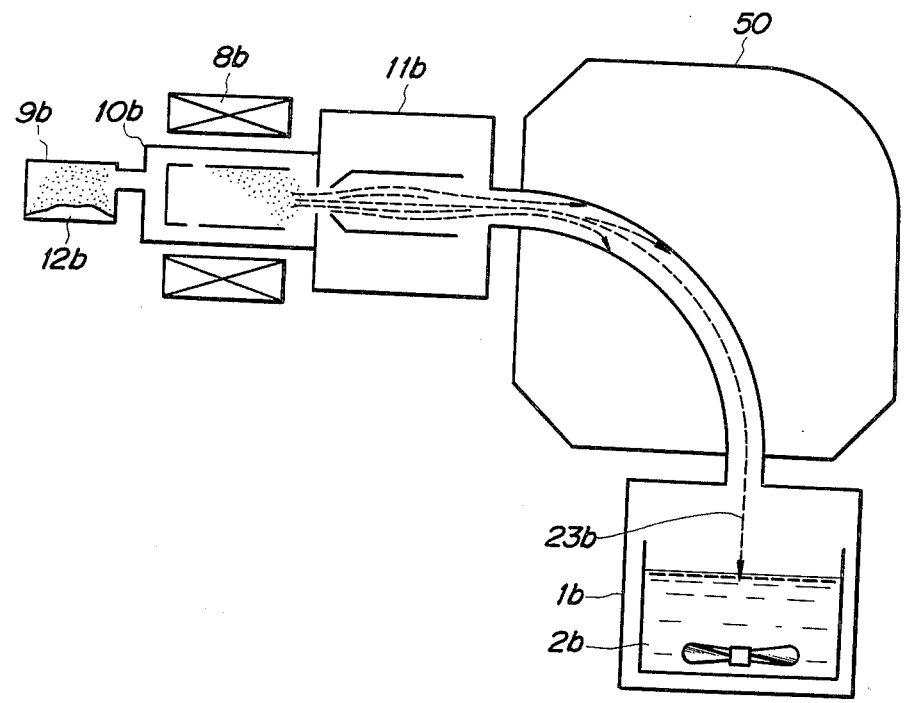
FIG. 3 is a schematic illustration of a third embodiment of an apparatus of the present invention.

A third embodiment of a phosphor preparing apparatus in accordance with the present invention is schematically shown in FIG. 3. Here, a base activating vessel section 1b and an activator ion source section 8b consists of an activator vapor generator 9b, an ion generating section 10b and an ion accelerating section 11b, as in the case of the first embodiment. In addition, a mass separator 50 is arranged between the ion accelerating section 11b and the base activating vessel 1b. The mass separator 50 passes the required ions with good activator purity only out of the ions which enter it with kinetic energy, being accelerated thereinto from the ion accelerating section 11b, and absorbs unnecessary ions, so as not to pass them to the base activating vessel sections 1b. Since extremely pure activator ions 23b alone collide with the base material 2b in the base activating vessel section 1b, the mass separator 50 fully demonstrates its excellent performance in the manufacture of phosphors with good purity. Any single activator element that may render it difficult to generate its vapor is place in combination in the vapor generator 9b to produce the vapor of the compound containing the activator. The generated vapor is employed to generate ions of compound constituents in the ion generating section 10b. Of these ions, required activator ions alone can be selected in the mass separator 50 and injected into the base activating vessel section 1b. Thus, the mass separator 50 provides the excellent feature of increasing and facilitating the production of various phosphors.

Another embodiment will now be described which prepares the phosphor ZnS:Mn by the method of this invention, using ZnS as the phosphor base material and Mn as the activator. As the phosphor base material, powdered ZnS is put in, for example, the base vessel 3a illustrated in FIG. 2, and Mn is placed in the crucible 33 as the activator material. The external vacuum container 25a is evacuated to a high vacuum of better than approximately $10^{-3}$ mmHg, and preferably $10^{-4}$ mmHg. Power is supplied to the agitator 4a and the heater 5a of the base activating vessel 3a for their operation. While being agitated, the powdered base material ZnS in the base vessel 3a is heated to approximately 500°C to 600°C. Power is also supplied to the activator vapor generating section 31 and the ion generating section 32 of the activator ion source 30, which in turn are operated to produce positive ions of the activator Mn. These positive Mn ions are given a kinetic energy of over 5 KeV, and preferably of over 10KeV, by an electric field formed by the ion accelerating electrode section 41 and are irradiated and injected into the base material ZnS. Thus, the powdered base material ZnS in the base vessel 3a is injected and replaced with the Mn ions at a low temperature of approximately 500°C to 600°C to provide luminescent centers, forming the phosphor ZnS:Mn very effectively.

It would be needless to say that the greater the kinetic energy imparted, the more effectively and efficiently the phosphor will be produced. While ZnS is used as the base material and Mn as the activator material in this embodiment, it would be obvious that various other base materials and activators can also be used effectively.

In order to mix the base material ZnS, the activator Mn and a flux and inject the Mn ions into the crystals of the base material ZnS through the contact surfaces of the crystals in an atmosphere fully controlled to prevent decomposition, change of properties or the like, the conventional method has called for heating these materials to approximately 1200°C, a temperature high enough to decompose them, and holding them for as long as a few hours for baking. In contrast, the method of this invention can prepare phosphors with smaller sized apparatus, under very safe conditions of temperature and atmosphere, without any risk of decomposition or other disadvantages as were encountered in the conventional method.

As heretofore described, the present invention provides a novel method and apparatus for making phosphors by activating the base material through injection of activator ions and affords various features and many effects, such as, by way of example:

1. Since the method for making phosphors according to this invention generates activator ions and irradiates and injects the generated ions into the base material in a low-pressure atmosphere, it provides for the production of extremely clean, pure and good phosphors, free from any contamination or change of properties due to the atmosphere;

2. Since the method of this invention for making phosphors does not require the base material and activator to be heated in a controlled atmosphere at a sufficiently high temperature for a sufficiently long time to decompose the materials, as in the baking step of the conventional method, and effects the heating of the materials at a temperature low enough to eliminate any danger of decomposition and in a low-pressure atmosphere, it permits making phosphors under easy-to-control, very stable and realiable conditions and methods while utilizing apparatus of considerably smaller size than required under former methods;

3. The method and apparatus for making phosphors according to this invention are applicable to the manufacture of virtually all types of phosphors that are formed by activating a base material with an activator; and 4. Since the manufacturing apparatus according to the present invention permits the internal base powder to be observed through an internal observation structure provided in the external vacuum container, it enables operation by applying a voltage between the charge neutralizing electrode and base powder at a suitable time during manufacture of the phosphor while observing the progress of the base powder being activated and turned into the phosphor, a control operation which is impossible to carry out using former apparatus and methods.

Various other objects, features and attendant advantages of this invention are possible in light of these teachings. It is therefore to be understood that within the scope of the appended claims, the invention may be practiced otherwise than as specifically described herein.

What is claimed as new and desired to be secured by letters patent of the United States is:

1. An apparatus for preparing phosphor comprising:
an activator ion source section having means for generating activator ions;
an ion accelerating electrode section for accelerating and irradiating activator ions generated by said activator ion source section into base material of said phosphor;
a base activating vessel section having an agitating means for containing the base material of said phosphor and for continuously circulating said base material therein in order to uniformly irradiate accelerated activator ions into said base material of said phosphor; and
a vacuum system for providing a low-pressure atmosphere for at least said activator ion source section and said base activating vessel section.

2. The apparatus as set forth in claim 1, wherein said vacuum system is provided with a charge neutralizing electrode to neutralize charges accumulated on the surface of said base material.

3. The apparatus as set forth in claim 1, wherein means are provided for visually observing said base material from outside said vacuum system.

4. The apparatus as set forth in claim 1, wherein means are provided for heating said base material in said base activating vessel section.

5. The apparatus as set forth in claim 1, further comprising a mass separating means disposed between said activator ion source section and said base activating vessel section.

* * * * *